(12) United States Patent
Huang et al.

(10) Patent No.: US 12,242,314 B2
(45) Date of Patent: Mar. 4, 2025

(54) GRAPHICS CARD ASSEMBLY AND SERVER (71) Applicants: INVENTEC (PUDONG) TECHNOLOGY CORPORATION, Shanghai (CN); INVENTEC CORPORATION, Taipei (TW)

(72) Inventors: Wen-Long Huang, Shanghai (CN); Xishan Shen, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 124 days.

(21) Appl. No.: 18/128,165

(22) Filed: Mar. 29, 2023

(65) Prior Publication Data
US 2024/0310883 A1  Sep. 19, 2024

(30) Foreign Application Priority Data
Mar. 15, 2023  (CN) ......................... 202310251671.4

(51) Int. Cl.
*G06F 1/18* (2006.01)
*H05K 7/14* (2006.01)

(52) U.S. Cl.
CPC .......... *G06F 1/185* (2013.01); *H05K 7/1424* (2013.01); *H05K 7/1461* (2013.01)

(58) Field of Classification Search
None
See application file for complete search history.

(56) References Cited

U.S. PATENT DOCUMENTS

| 11,369,033 B1* | 6/2022 | Tsorng | H05K 7/1487 |
| 2008/0106862 A1* | 5/2008 | Liang | H05K 1/14 |
| | | | 361/679.41 |
| 2011/0249397 A1* | 10/2011 | Liu | G06F 1/185 |
| | | | 361/784 |
| 2021/0410315 A1* | 12/2021 | Pham | H05K 7/1489 |
| 2022/0057848 A1* | 2/2022 | Chang | H05K 5/0265 |

* cited by examiner

*Primary Examiner* — James Wu
*Assistant Examiner* — Christopher L Augustin
(74) *Attorney, Agent, or Firm* — Maschoff Brennan (57) ABSTRACT

A graphics card assembly includes a mounting cage, two riser cards and two graphics cards. The mounting cage has two accommodation spaces arranged side by side horizontally. The two riser cards are disposed on the mounting cage and are located in the two accommodation spaces, respectively. The two graphics cards are located in the two accommodation spaces and are detachably inserted into the two riser cards, respectively.

6 Claims, 10 Drawing Sheets

GRAPHICS CARD ASSEMBLY AND SERVER

CROSS-REFERENCE TO RELATED APPLICATIONS

This non-provisional application claims priority under 35 U.S.C. § 119(a) on Patent Application No(s). 202310251671.4 filed in China, on Mar. 15, 2023, the entire contents of which are hereby incorporated by reference.

BACKGROUND OF THE INVENTION

Technical Field of the Invention

The invention relates to a graphics card assembly and a server, more particularly to a graphics card assembly capable of accommodating two graphics cards and a server including the graphics card assembly.

Description of the Related Art

In a server, an expansion card has a plurality of purposes, such as image processing, network interface, peripheral device interface and data storage. Users may install the expansion card in the server according to their own needs so as to expand the function of the server.

In order to expand more functions of a server, users may install a plurality of expansion cards in the server. However, an interior space of a casing of the server is limited. If the expansion cards are too large, the server cannot accommodate these expansion cards, so that it is difficult for users to expand more functions of the computer according to their own needs. Therefore, how to install the multiple expansion cards in the limited interior space of the casing of the server is an important issue to be solved.

SUMMARY OF THE INVENTION

The invention provides a graphics card assembly and a server which enable multiple the plurality of expansion cards to be installed in the limited interior space of the casing of the server.

One embodiment of the invention provides a graphics card assembly including a mounting cage, two riser cards and two graphics cards. The mounting cage has two accommodation spaces arranged side by side horizontally. The two riser cards are disposed on the mounting cage and are located in the two accommodation spaces, respectively. The two graphics cards are located in the two accommodation spaces and are detachably inserted into the two riser cards, respectively.

Another embodiment of the invention provides a server including a casing and a graphics card assembly. A height of the casing is 1 U. A height of the graphics card assembly is smaller than or equal to 1 U. The graphics card assembly includes a mounting cage, two riser cards and two graphics cards. The mounting cage has two accommodation spaces arranged side by side horizontally. The two riser cards are disposed on the mounting cage and are located in the two accommodation spaces, respectively. The two graphics cards are located in the two accommodation spaces and are detachably inserted into the two riser cards, respectively.

According to the graphics card assembly and the server, since the two graphics cards, from which the cover pieces are removed in advance, are mounted on the mounting cage and arranged side by side horizontally to form the graphics card assembly, the casing of the 1 U server can accommodate the graphics card assembly with two graphics cards, so that more functions of the computer can be expanded.

In addition, since the second assembly structure is located at the back side of the disk drive assembly, when removing the disk drive assembly, the operator may check whether the external cables are completely removed from the disk drive assembly so as to avoid tearing the external cables when removing the disk drive assembly.

BRIEF DESCRIPTION OF THE DRAWINGS

The present invention will become more fully understood from the detailed description given herein below and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 1:
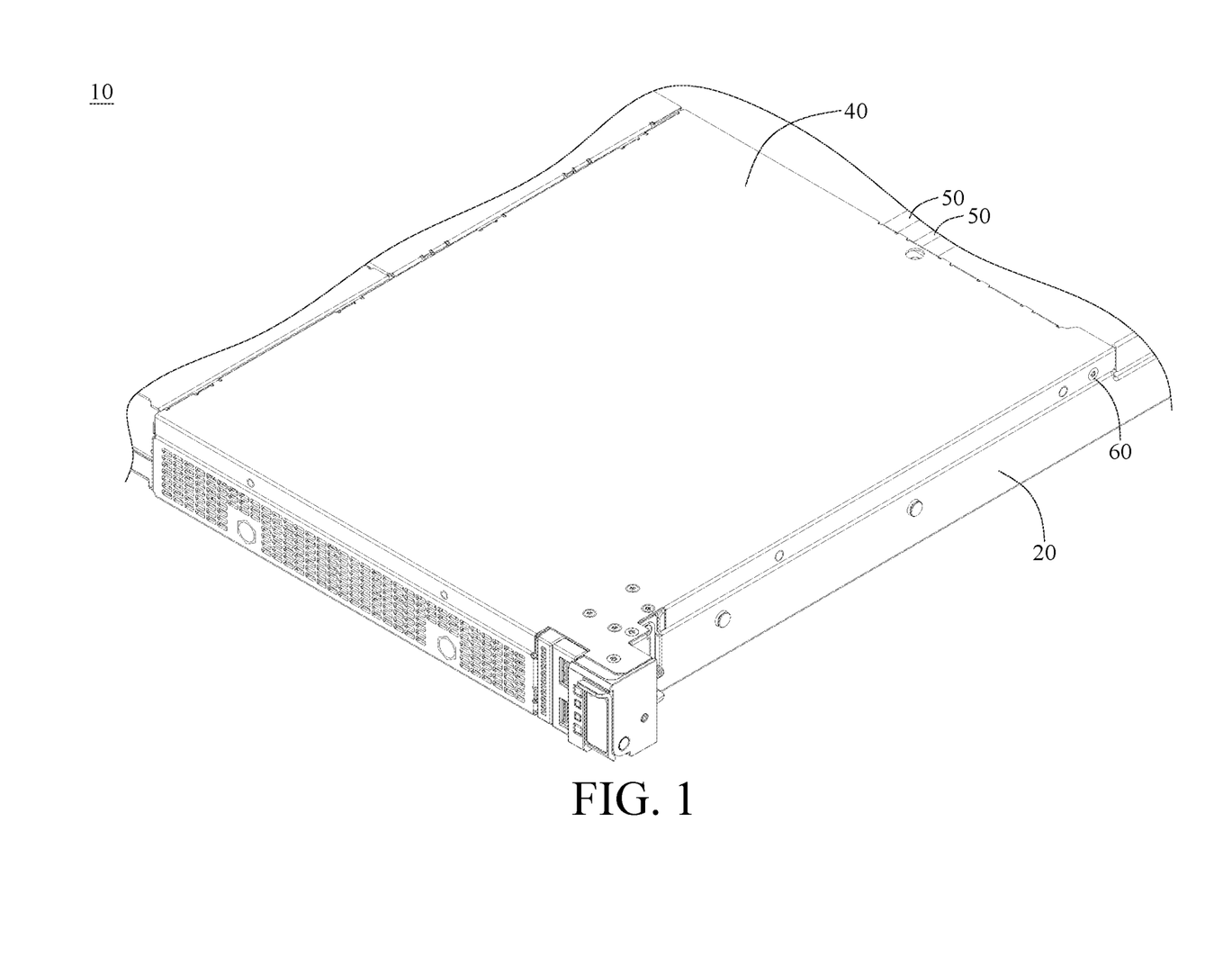
FIG. 1 is a partial perspective view of a server in accordance with one embodiment of the invention.
Figure 2:
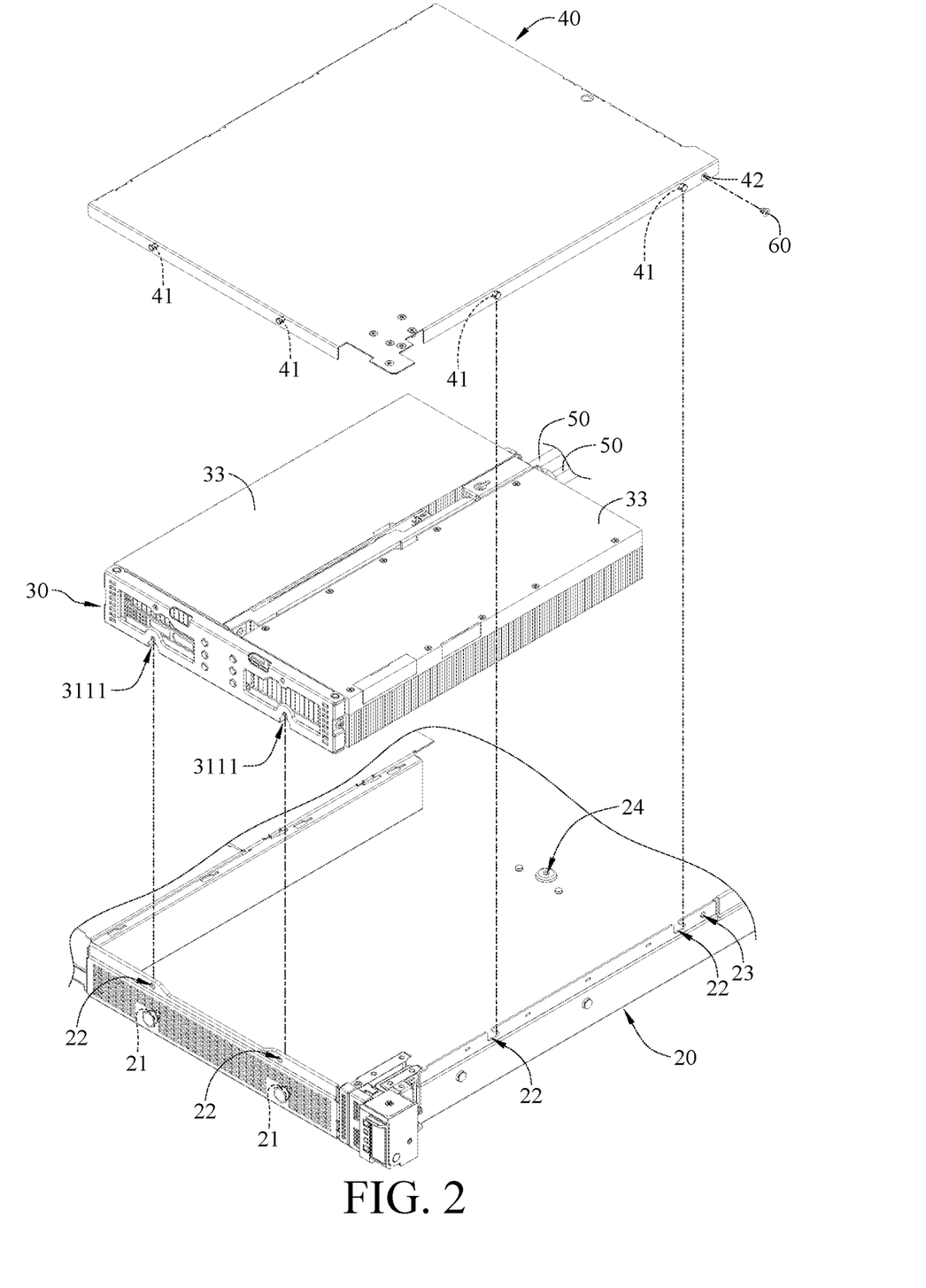
FIG. 2 is an exploded view of the server in FIG. 1.

Please refer to FIG. 1 to FIG. 2, where FIG. 1 is a partial perspective view of a server in accordance with one embodiment of the invention, and FIG. 2 is an exploded view of the server in FIG. 1.

In this embodiment, the server 10 includes a casing 20, a graphics card assembly 30, a cover 40 and two cables 50. A height of the casing 20 is, for example, 1 U. A height of the graphics card assembly 30 is, for example, smaller than or equal to 1 U. The so-called 1 U refers to a rack unit for calibrating an equipment, such as a server, where the height of 1 U is about 4.445 centimeters (cm).

Figure 3:
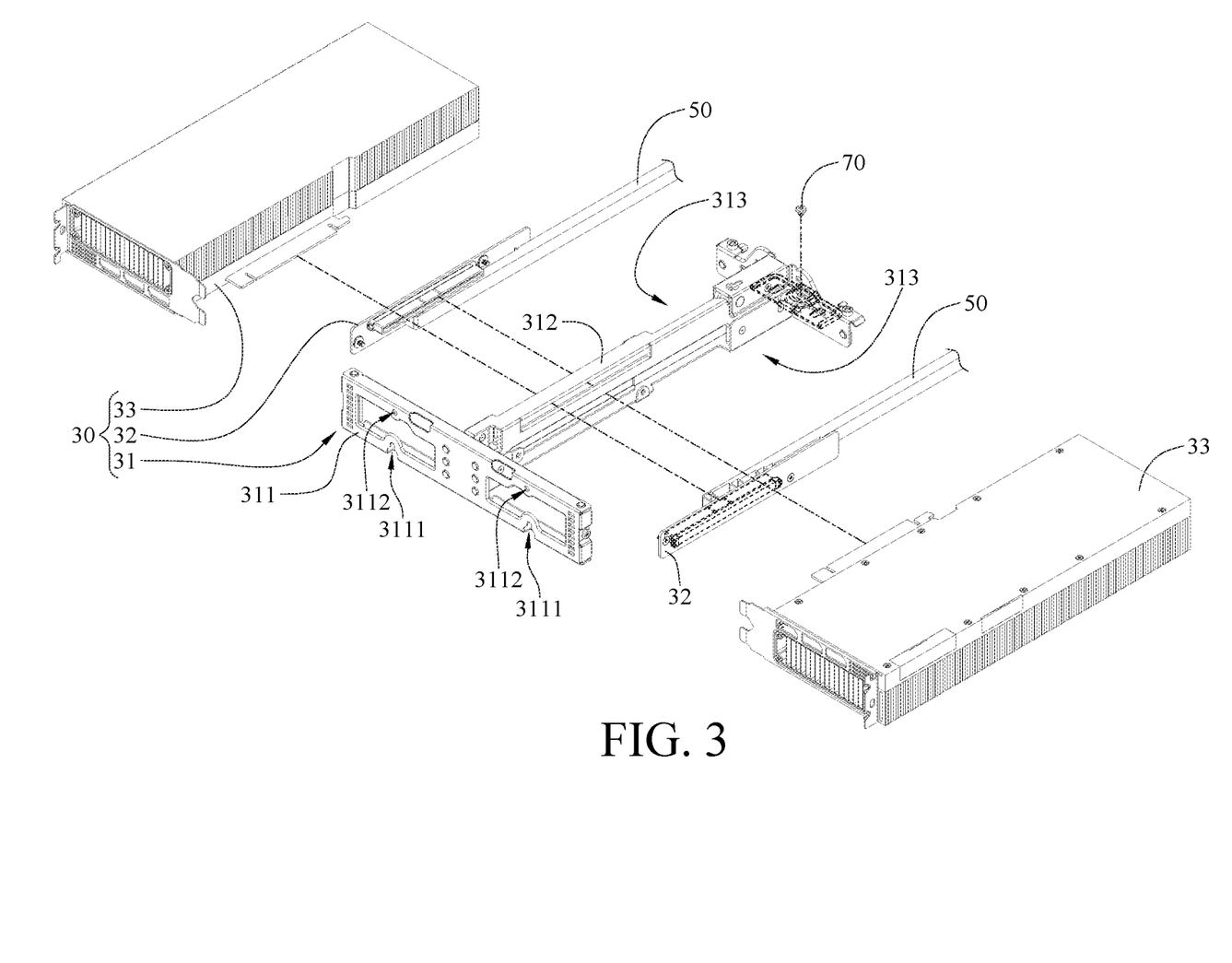
FIG. 3 is an exploded view of a graphics card assembly in FIG. 1.

Please refer to FIG. 3, which is an exploded view of a graphics card assembly in FIG. 1. The graphics card assembly 30 includes a mounting cage 31, two riser cards 32 and two graphics cards 33. The mounting cage 31 includes a front plate 311 and a partition 312. One side of the partition 312 is connected to a central portion of the front plate 311, and the partition 312 and the front plate 311 together form a T-shaped structure, so that the partition 312 separates two accommodation spaces 313 arranged side by side horizontally. The two riser cards 32 are disposed on the partition 312 of the mounting cage 31, and are located in the two accommodation spaces 313, respectively. The two graphics cards 33 are, for example, two double-width graphics cards. The two graphics cards 33 are located in the two accommodation spaces 313, respectively, and are detachably inserted into the two riser cards 32. That is, the two graphics cards 33 are located in the two accommodation spaces 313 arranged side by side horizontally, respectively. The cover 40 is disposed on the casing 20, and covers the graphics card assembly 30. The two cables 50 are disposed on the two riser cards 32 and connected to an external power supply (not shown), respectively.

Figure 4:
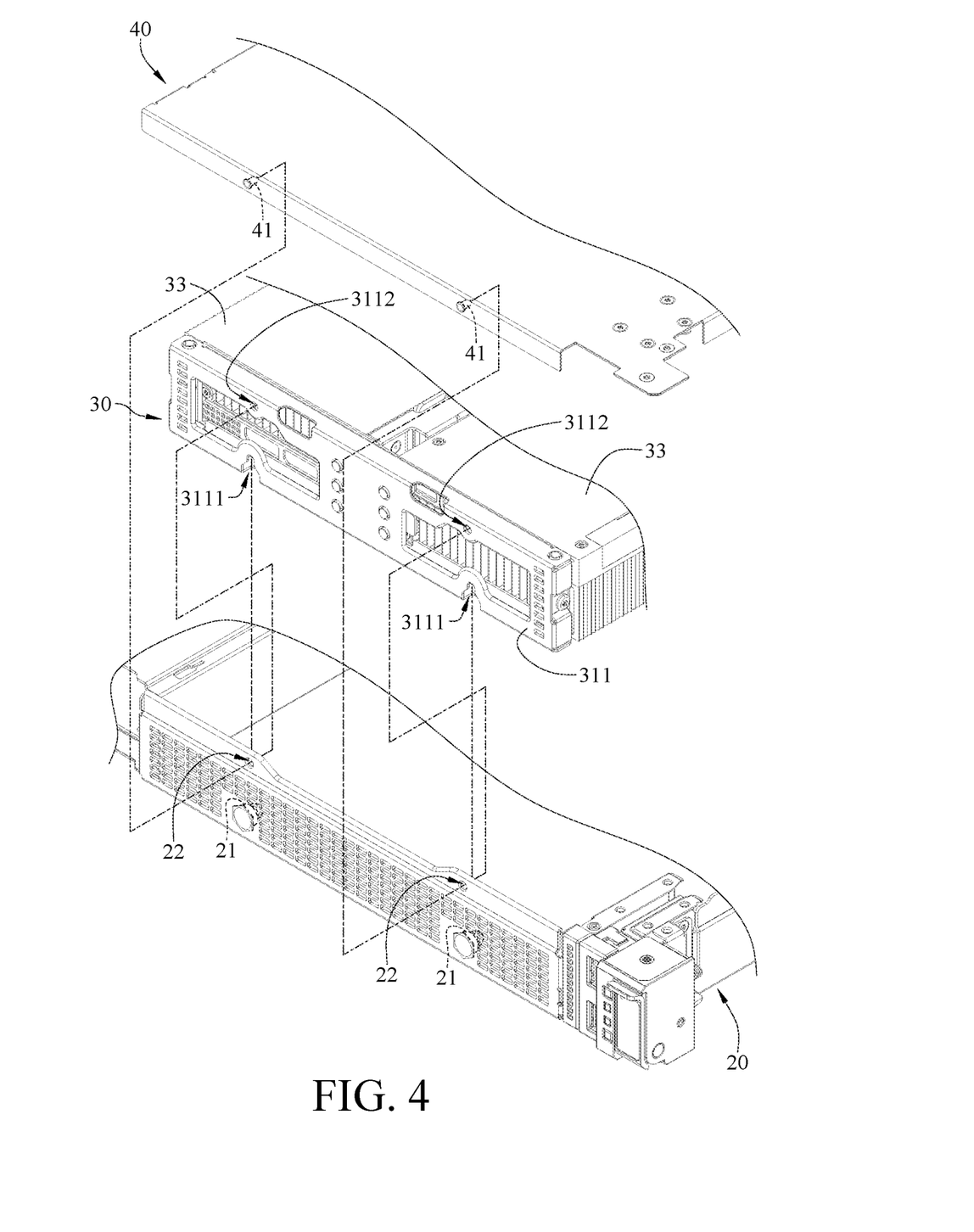
FIG. 4 is a partial, enlarged and exploded view of the server in FIG. 1.
Figure 5:
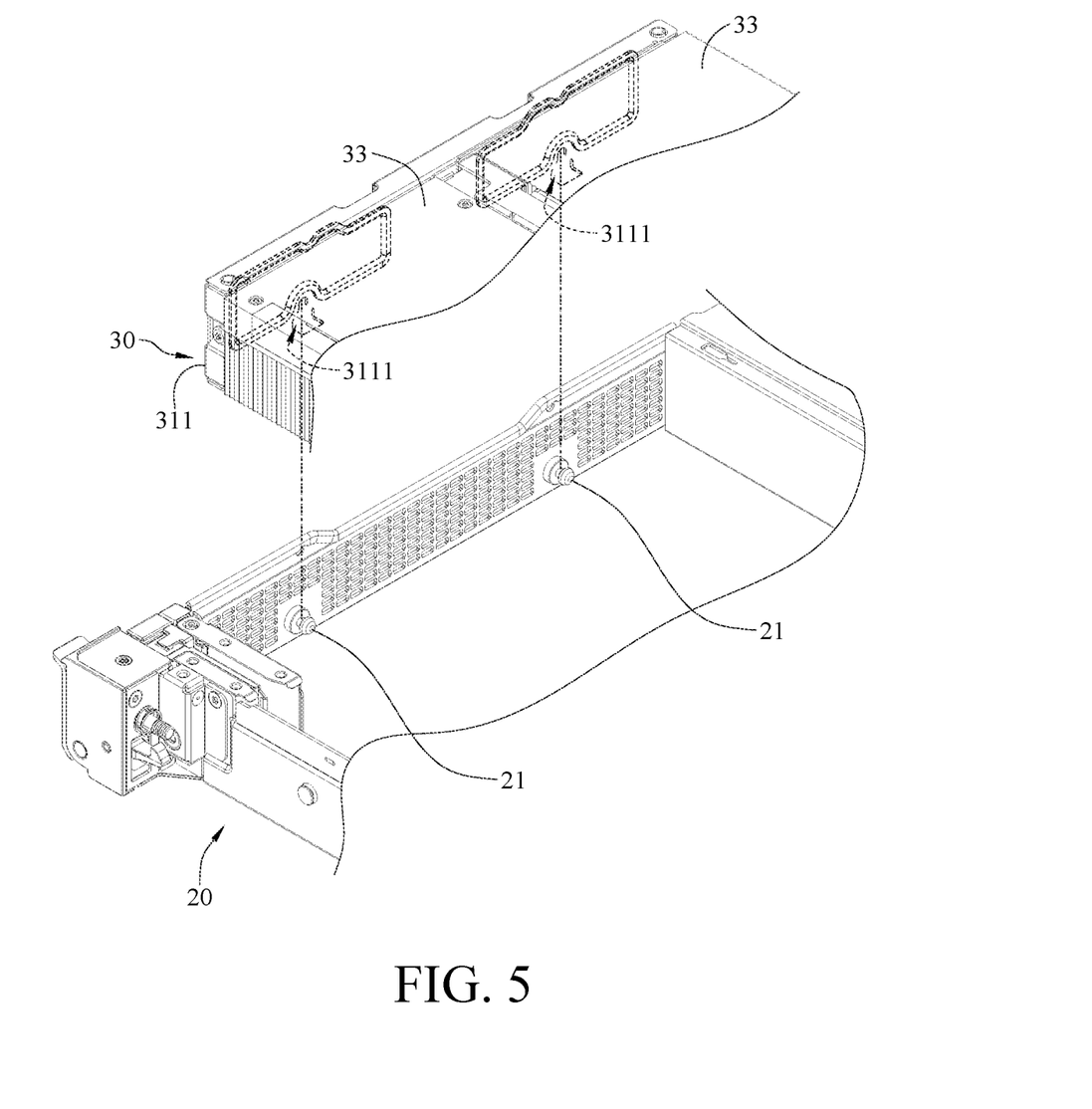
FIG. 5 is another partial, enlarged and exploded view of the server in FIG. 1.
Figure 6:
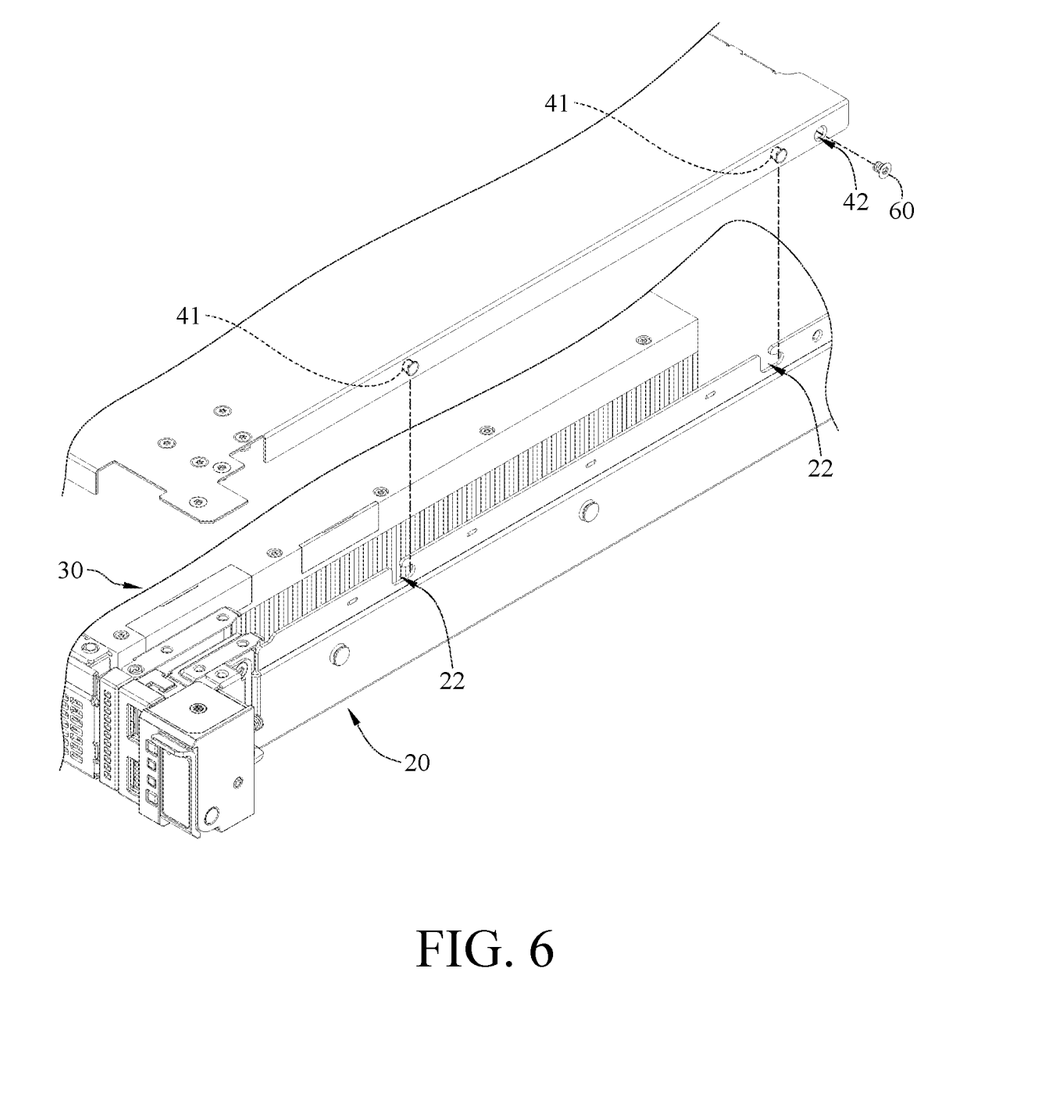
FIG. 6 is another partial, enlarged and exploded view of the server in FIG. 1.

Please refer to FIG. 4 to FIG. 6, where FIG. 4 is a partial, enlarged and exploded view of the server in FIG. 1, FIG. 5 is another partial, enlarged and exploded view of the server in FIG. 1, and FIG. 6 is another partial, enlarged and exploded view of the server in FIG. 1.

In this embodiment, the casing 20 has two engagement blocks 21. The front plate 311 of the mounting cage 31 has two engagement recesses 3111. The two engagement recesses 3111 are engaged with the two engagement blocks 21, respectively, so as to position the graphics card assembly 30. In addition, the server 10 includes a first fastener 60. The cover 40 has a plurality of positioning blocks 41 located at two adjacent sides of the cover 40, and the cover 40 further has a first through hole 42. The casing 20 have a plurality of second through holes 22 located at two adjacent sides of the casing 20 and a first fastening hole 23. The front plate 311 of the mounting cage 31 has a plurality of third through holes 3112. The third through holes 3112 of the front plate 311 correspond to the second through holes 22 located at one side of the casing 20, and the first through hole 42 of the cover 40 corresponds to the first fastening hole 23 of the casing 20. The first fastener 60 is, for example, a screw, and the first fastening hole 23 is, for example, a screw hole. The positioning blocks 41 located at one side of the cover 40 are disposed through the second through holes 22 and the third through holes 3112 so as to position the cover 40 and the mounting cage 31. The positioning blocks 41 located at another side of the cover 40 are disposed through the second through holes 22 so as to position the cover 40. The cover 40 is fixed to the casing 20 after the first fastener 60 is disposed through the first through hole 42 and screwed into the first fastening hole 23.

Figure 7:
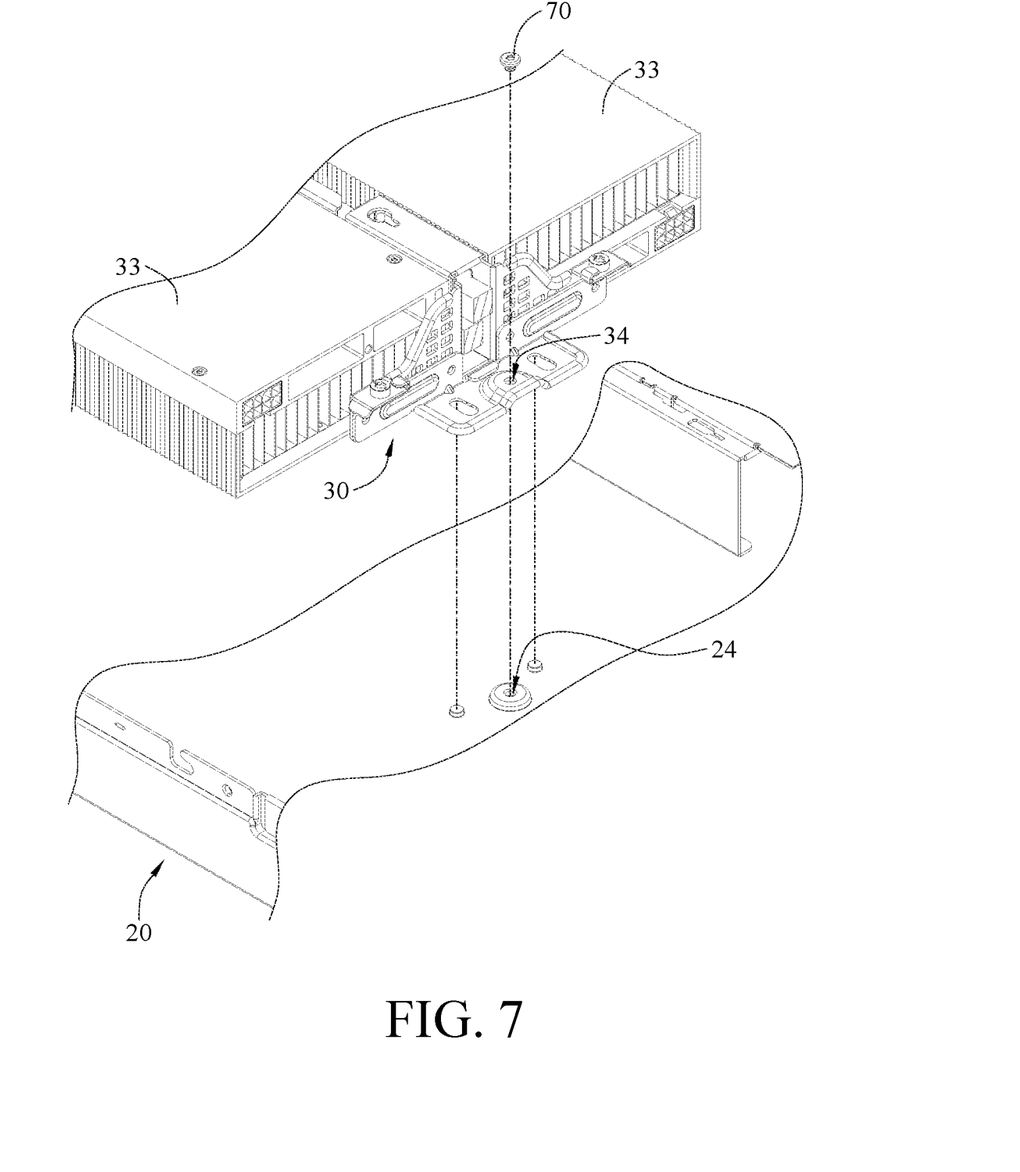
FIG. 7 is another partial, enlarged and exploded view of the server in FIG. 1.

Please refer to FIG. 7, which is another partial, enlarged and exploded view of the server in FIG. 1. In this embodiment, the server 10 includes a second fastener 70. The graphics card assembly 30 has a fourth through hole 34. The casing 20 has a second fastening hole 24. The fourth through hole 34 corresponds to the second fastening hole 24. The second fastener 70 is, for example, a screw, and the second fastening hole 24 is, for example, a screw hole. One side of the graphics card assembly 30 located opposite to the front plate 311 is fixed to the casing 20 after the second fastener 70 is disposed through the fourth through hole 34 and screwed into the second fastening hole 24.

In this embodiment, each of the two graphics cards 33 does not include a cover piece so that the two graphics cards 33 have relatively small sizes. Therefore, the two graphics cards 33 do not interfere with the cover 40 during the installation of the cover 40, so that the two graphics cards 33 can be mounted in the two accommodation spaces 313, respectively.

In this embodiment, since the casing 20 of the server 10 can accommodate the two double-width graphics cards 33, the casing 20 is also suitable to accommodate other two common graphics cards smaller sizes than that of the two double-width graphics cards 33. Therefore, the casing 20 of the server 10 may be also fitted to graphics cards in various sizes.

Figure 8:
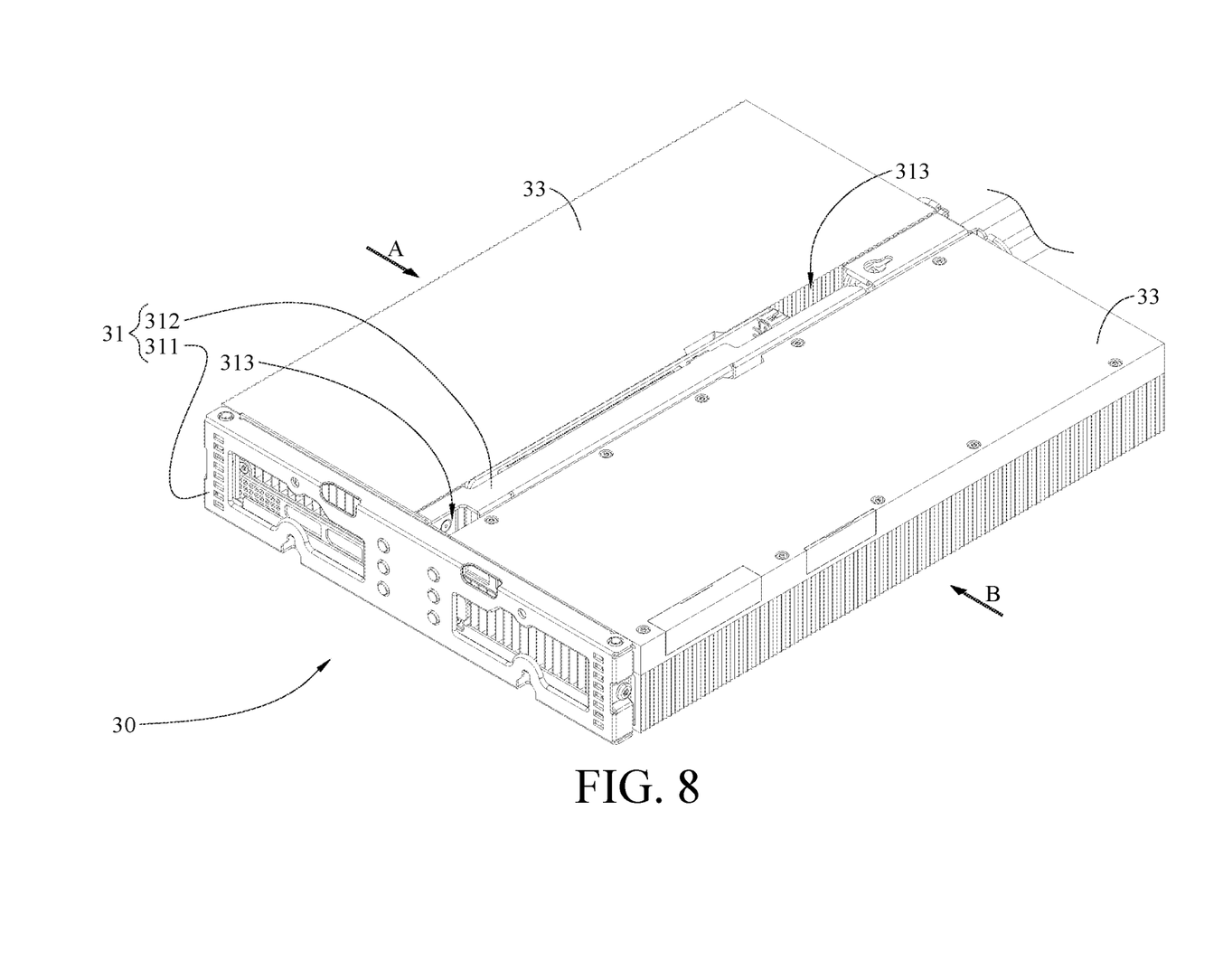
FIG. 8 is a partial perspective view showing that two graphics cards are mounted on a mounting cage in FIG. 1.
Figure 9:
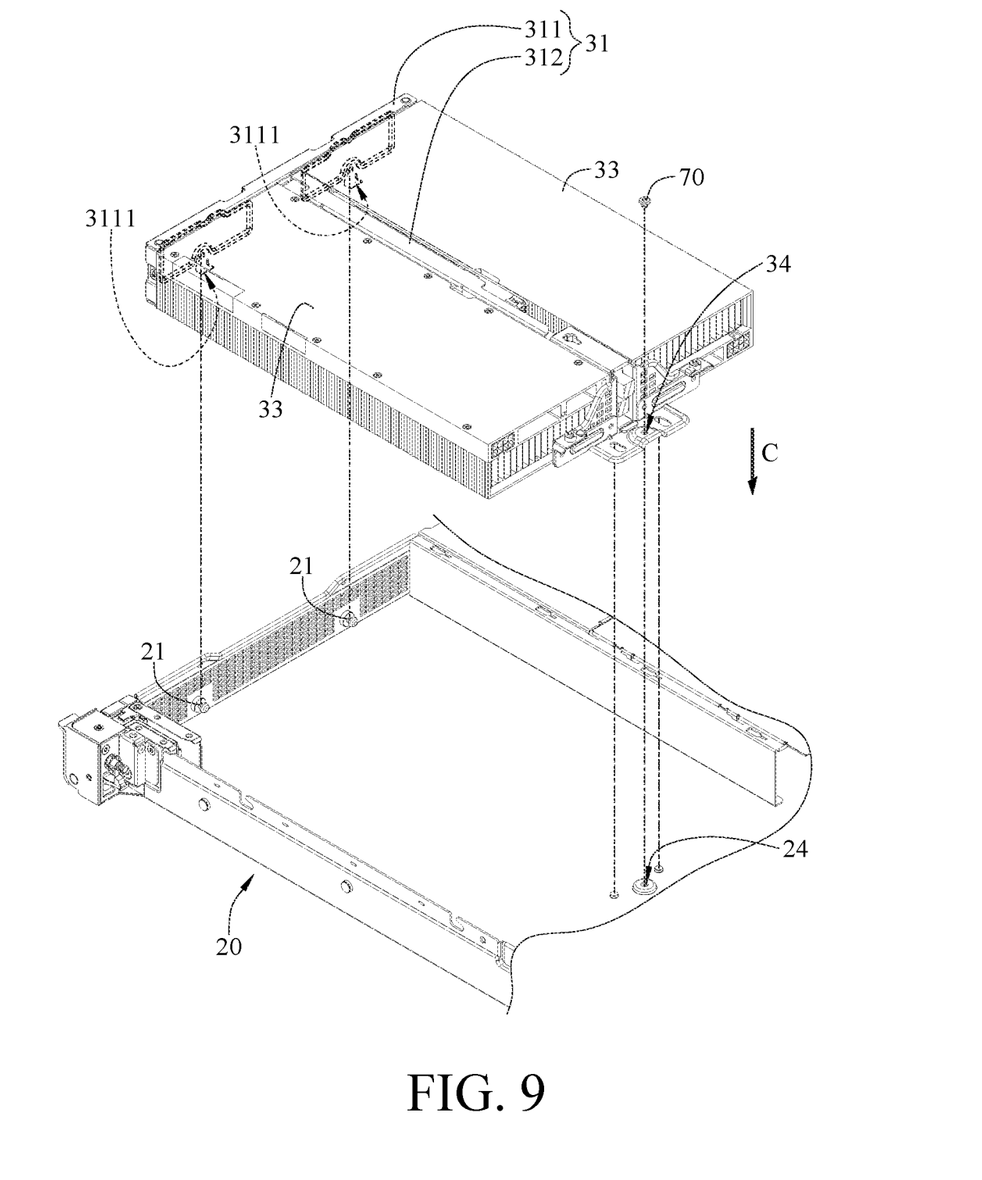
FIG. 9 is a partial perspective view showing that the graphics card assembly is about to be mounted in a casing in FIG. 1.
Figure 10:
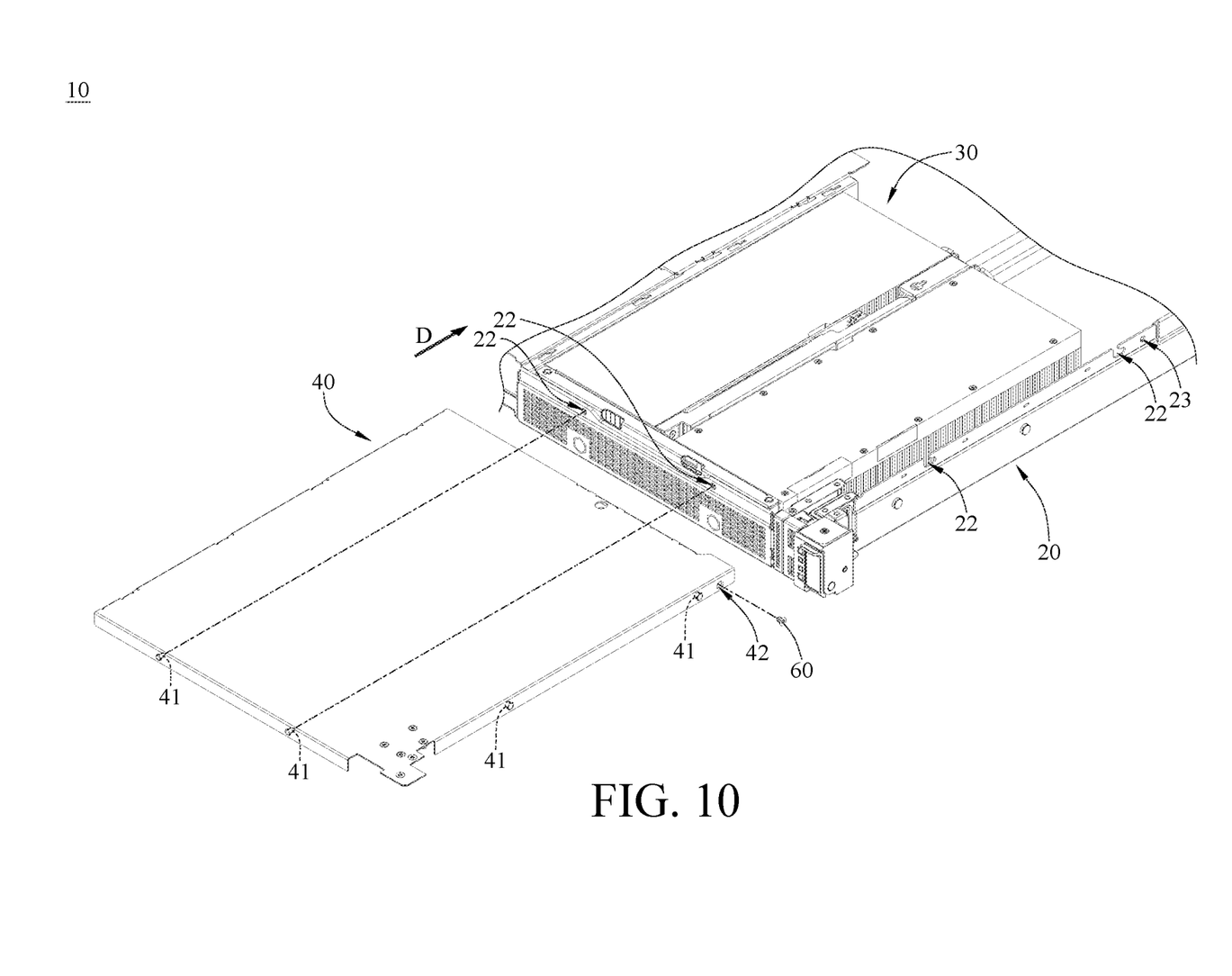
FIG. 10 is a partial perspective view showing that a cover is about to be mounted on the casing in FIG. 1.

Please refer to FIG. 8 to FIG. 10, where FIG. 8 is a partial perspective view showing that two graphics cards are mounted on a mounting cage in FIG. 1, FIG. 9 is a partial perspective view showing that the graphics card assembly is about to be mounted in a casing in FIG. 1, and FIG. 10 is a partial perspective view showing that a cover is about to be mounted on the casing in FIG. 1.

As shown in FIG. 8, when the two graphics cards 33 are required to be mounted in the server 10, the two double-width graphics cards 33, from which the cover pieces are removed in advance, are firstly inserted into the two riser cards 32 along directions A and B, respectively so as to be mounted on the T-shaped mounting cage 31 for forming the graphics card assembly 30. At this moment, the two graphics cards 33 are located in the two accommodation spaces 313 of the mounting cage 31 arranged side by side horizontally, respectively.

Then, as shown in FIG. 9, the graphics card assembly 30 is vertically placed into the server 10 along a direction C, and the two engagement recesses 3111 of the front plate 311 of the graphics card assembly 30 are engaged with the two engagement blocks 21 of the casing 20, respectively, so that the graphics card assembly 30 is positioned in the server 10. Then, the side of the graphics card assembly 30 located opposite to the front plate 311 is fixed to the server 10 via the first fastener 60.

Then, as shown in FIG. 10, the cover 40 is horizontally mounted on the server 10 along a direction D, and covers the graphics card assembly 30. The positioning blocks 41 of the cover 40 are disposed through the second through holes 22 of the casing 20 so as to position the cover 40. Then, the cover 40 is fixed to the server 10 via the second fastener 70. Since the two graphics cards 33 do not include a cover piece and are disposed on the T-shaped mounting cage 31 and arranged side by side horizontally, the casing 20 of the 1 U server 10 can accommodate the two double-width graphics cards 33 without being interfering with the cover 40. In addition, the graphics card assembly 30 is vertically placed into the server 10 along the direction C for facilitating the installation of the graphics card assembly 30.

According to the graphics card assembly and the server, since the two graphics cards, from which the cover pieces are removed in advance, are mounted on the mounting cage and arranged side by side horizontally to form the graphics card assembly, the casing of the 1 U server can accommodate the graphics card assembly with two graphics cards, so that more functions of the computer can be expanded.

It will be apparent to those skilled in the art that various modifications and variations can be made to the present invention. It is intended that the specification and examples be considered as exemplary embodiments only, with the scope of the invention being indicated by the following claims and their equivalents.

What is claimed is:

1. A graphics card assembly, comprising:
a mounting cage, having two accommodation spaces arranged side by side horizontally, wherein the mounting cage comprises a front plate and a partition, the front plate has at least one engagement recess and a plurality of through holes, and the at least one engagement recess is configured to be engaged with at least one engagement block of a casing, the plurality of through holes of the front plate are configured to correspond to a plurality of through holes of the casing, one side of the partition is connected to a central portion of the front plate, and the partition separates the two accommodation spaces from each other;
two riser cards, disposed on the mounting cage and located in the two accommodation spaces, respectively; and
two graphics cards, located in the two accommodation spaces and detachably inserted into the two riser cards, respectively;
wherein at least a part of the plurality of through holes of the front plate and at least a part of the plurality of through holes of the casing are configured for at least a part of a plurality of positioning blocks of a cover to be disposed through to position the mounting cage and the cover.

2. The graphics card assembly according to claim 1, wherein a height of the graphics card assembly is smaller than or equal to 1 U.

3. The graphics card assembly according to claim 1, wherein each of the two graphics cards does not comprise a cover piece.

4. The graphics card assembly according to claim 1, further comprising two cables, wherein the two cables are disposed on the two riser cards, respectively.

5. A server, comprising:
a cover, comprising a plurality of positioning blocks;
a casing, wherein a height of the casing is 1 U, the casing has at least one engagement block and a plurality of through holes; and
a graphics card assembly, wherein a height of the graphics card assembly is smaller than or equal to 1 U, and the graphics card assembly comprises:
a mounting cage, having two accommodation spaces arranged side by side horizontally, wherein the mounting cage comprises a front plate and a partition, the front plate has at least one engagement recess and a plurality of through holes, the at least one engagement recess is engaged with the at least one engagement block, the plurality of through holes of the front plate correspond to the plurality of through holes of the casing, one side of the partition is connected to a central portion of the front plate, and the partition separates the two accommodation spaces from each other;
two riser cards, disposed on the mounting cage and located in the two accommodation spaces, respectively; and
two graphics cards, located in the two accommodation spaces and detachably inserted into the two riser cards, respectively;
wherein at least a part of the plurality of positioning blocks are disposed through at least a part of the plurality of through holes of the casing and at least a part of the plurality of through holes of the front plate to position the cover and the mounting cage.

6. The server according to claim 5, further comprising two cables, wherein the two cables are disposed on the two riser cards, respectively, and each of the two graphics cards does not comprise a cover piece.

* * * * *